United States Patent [19]

Nguyen

[11] Patent Number: 5,408,145
[45] Date of Patent: Apr. 18, 1995

[54] LOW POWER CONSUMPTION AND HIGH SPEED NOR GATE INTEGRATED CIRCUIT

[75] Inventor: Bai Y. Nguyen, San Jose, Calif.

[73] Assignee: Advanced Micro Devices, Inc., Sunnyvale, Calif.

[21] Appl. No.: 17,084

[22] Filed: Feb. 12, 1993

[51] Int. Cl.⁶ .................................. H03K 19/0948
[52] U.S. Cl. .................................. 326/121; 326/112; 326/108
[58] Field of Search .............. 307/448, 451, 445, 449, 307/296.6, 310, 443

[56] References Cited

U.S. PATENT DOCUMENTS

| | | | |
|---|---|---|---|
| 4,797,580 | 1/1989 | Sunter | 307/448 |
| 4,972,102 | 11/1990 | Reis et al. | 307/449 |
| 5,021,686 | 6/1991 | Kawata et al. | 307/451 |
| 5,039,882 | 8/1991 | Arakawa | 307/449 |
| 5,117,130 | 5/1992 | Shoji | 307/448 |
| 5,151,622 | 9/1992 | Thrower et al. | 307/448 |
| 5,187,394 | 2/1993 | Hoshizaki et al. | 307/449 |
| 5,291,076 | 3/1994 | Bridges et al. | 307/452 |

OTHER PUBLICATIONS

Chen, John Y., CMOS Devices and Technology for VLSI; ©1990 by Prentice-Hall; pp. 92–95.

Primary Examiner—Edward P. Westin
Assistant Examiner—Benjamin D. Driscoll
Attorney, Agent, or Firm—Skjerven, Morrill, MacPherson, Franklin & Friel

[57] ABSTRACT

A digital logic circuit is provided which eliminates excessive power consumption while providing high speed transitions between logic states. The digital logic circuit includes a pull-down device coupled to an input line. The digital logic circuit further comprises a weak pull-up device and a strong pull-up device coupled to the pull-down device at a node. A means for providing a signal on an output line of the programmable logic device is coupled to the pull-down device and the pull-up devices. The weak pull-up device holds the node high if the pull-down device is in an off state. However, if the pull-down device is in an on state, the strong pull-up device is also turned on, thereby providing a stable intermediate voltage on the node. A feedback path from the output line controls the state of the strong pull-up device.

20 Claims, 2 Drawing Sheets

LOW POWER CONSUMPTION AND HIGH SPEED NOR GATE INTEGRATED CIRCUIT

BACKGROUND OF THE INVENTION

1. Field of the Invention

The present invention relates to CMOS integrated circuits, and in particular to a CMOS NOR gate circuit.

2. Description of the Related Art

Digital logic circuits, including CMOS NOR gate circuits, are well known in the art. Referring to FIG. 1, a CMOS NOR gate 100 typically uses P-channel MOS transistors 104 and 105 as pull-up devices and N-channel MOS transistors 106 and 107 as pull-down devices. For example, if the input signals on lines 101 and 102 are low, the output signal on line 103 is high because of the low impedance connection to voltage source Vcc through turned-on P-channel transistors 104 and 105, and the high impedance connection to ground through turned-off N-channel transistors 106 and 107. In contrast, if the input signal on lines 101 and 102 is high, the path to voltage source Vcc is blocked and NOR gate 100 provides a low impedance connection to ground, thereby providing a low signal on line 103.

The output line 103 of NOR gate 100 is typically connected to a CMOS buffer (not shown) which functions as a driver for NOR gate 100. Note that an inverter (also not shown) coupled to line 103 transforms NOR gate 100 into an OR gate. Thus, a NOR gate circuit is used to implement both OR or NOR logic functions.

In digital logic circuits, both high speed and low power consumption are desired. Although NOR gate 100 provides low power consumption, its speed of switching voltages on line 103 is relatively slow. NOR gate 200, shown in FIG. 2, increases the speed of switching on line 203 by providing a strong pull-up transistor 204 for low to high voltage transistor and providing two strong pull-down transistors 206 and 207 for high to low voltage transitions. However, if pull-up transistor 204 is too strong, then NOR gate 200 consumes a significant amount of power when either transistors 206 and 207 are conducting, thereby creating an unstable, intermediate voltage level on line 203. Consequently, any driver coupled to line 203 also burns power. Furthermore, if input signals on lines 201 and 202 are at an intermediate level, NOR gate 200 operates at low efficiency because transistors 206 and 207 are turned on or off weakly, thereby also providing an unstable signal on line 203.

SUMMARY OF THE INVENTION

In accordance with the present invention, a digital logic circuit eliminates excessive power consumption while providing high speed transitions between output logic states. The digital logic circuit, having an input line and an output line, includes a pull-down device coupled to the input line. The digital logic circuit further includes a plurality of pull-up devices coupled to the pull-down device, wherein one of the plurality of pull-up devices is a weak pull-up device and another of the plurality of pull-up devices is a strong pull-up device. A means for providing a signal on the output line is coupled to the pull-down device and the plurality of pull-up devices.

The weak pull-up device holds a predetermined node high if the pull-down device is in an off state. However, if the pull-down device is in an on state, the strong pull-up device is also turned on, thereby providing an intermediate voltage on the predetermined node. The pull-down device in combination with the means for providing a signal on the output line clamp the value of the intermediate voltage on the predetermined node, irrespective of the strength of the strong pull-up device. This intermediate voltage provides an optimal preset condition for the next input signal transition.

In further accordance with the present invention, a feedback path, responding to the signal on the output line, controls the state of the strong pull-up transistor. This feedback path, in one embodiment of the present invention, is sensitive to both a temperature of the circuit as well as a voltage supply.

DETAILED DESCRIPTION OF THE DRAWINGS

Figure 3:
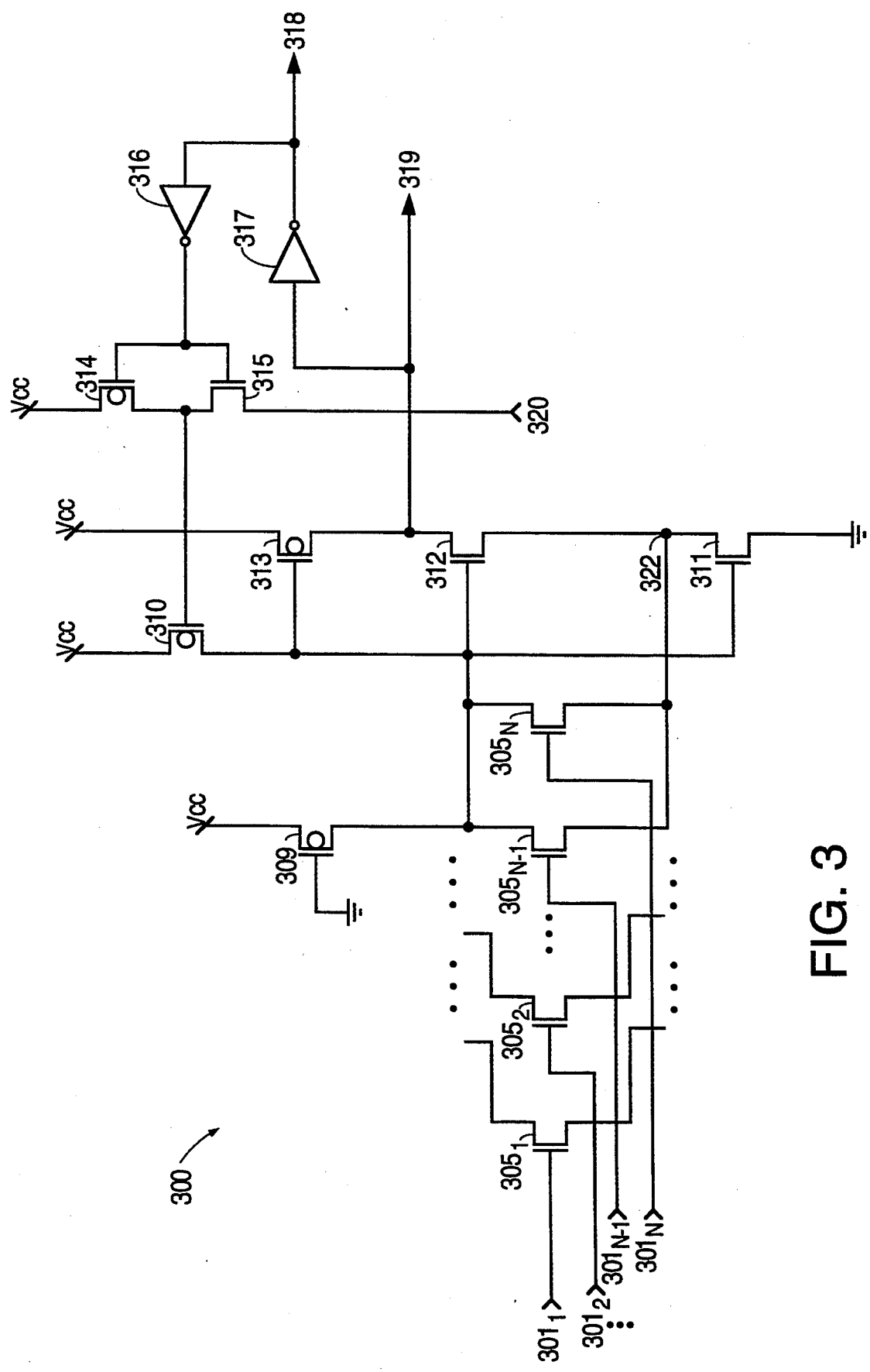
FIG. 3 shows a CMOS NOR gate in accordance with the present invention.

FIG. 3 illustrates a NOR gate 300 in accordance with the present invention which is capable of high speed operation with minimum power consumption. For purposes of illustration, assume that the input signals on lines 301 are low. These low signals, applied to the gates of N-channel transistors 305, turn off transistors 305. Because the gate of P-channel transistor 309 is coupled to ground (i.e. a low voltage), this transistor remains on at all times and transfers a current from voltage source Vcc, thereby providing a high voltage on node 321. This high voltage is provided to the gates of N-type transistors 311 and 312, thereby turning on those transistors. Note that this high voltage is also provided to the gate of P-type transistor 313, thereby turning off this transistor. In this manner, node 322 is quickly brought to a low voltage.

The low voltage on node 322, transferred through transistor 312 which is turned on, is subsequently provided to the input of inverter 317, thereby providing a high voltage on line 318 which is the output line of NOR gate 300. This high signal is then inverted by inverter 316 to provide a low voltage to the gate of P-channel transistor 314, thereby turning on transistor 314. The low voltage output from inverter 316 is also provided to the gate of N-channel transistor 315, thereby turning off this transistor. The on and off states of transistors 314 and 315, respectively, allows a current to flow from voltage source Vcc through transistor 314, thereby providing a high voltage to the gate of P-channel transistor 310. This high voltage keeps P-channel transistor 310 in an off state. Thus, the voltage provided to the gate of P-channel transistor 313 is substantially that of node 321 which is high. Therefore, transistor 313 also remains in an off state.

A pull-down device, for example transistor $305_2$, is turned on if the signal on input line $301_2$ goes high. In accordance with the present invention, N-channel transistors $305_1$–$305_N$ (where N represents the total number of pull-down devices) are strong pull-down devices, whereas P-channel transistor 309 is a weak pull-up transistor. Thus, if one or more of N-type transistors 305 are turned on, node 321 is quickly pulled down to a low voltage because of the path established through transistor 305 (which is turned on) to node 322 which is initially at a low voltage. The low voltage on node 321 is then applied to the gate of transistor 312, thereby turning off this transistor. This same low voltage, applied to the gate of transistor 313, turns this transistor on, thereby allowing a current from voltage source Vcc to provide a high voltage on line 319. Inverter 317 inverts the high voltage on line 319, and thus provides a low voltage on output line 318 of NOR gate 300. Inverter 316 inverts this low voltage and provides the resulting high voltage to the gate of transistor 314 (turning off this transistor) and to the gate of transistor 315 (turning on this transistor). As a result of this configuration, current flows through transistor 315 from a voltage source 320, wherein voltage source 320 is either ground or virtual ground (explained in detail below). This voltage node is used to control the current of MP2, thereby providing a low voltage to the gate of P-channel transistor 310 which turns on this transistor.

Because transistor 310 is on, current flows from voltage source Vcc through transistor 310, thereby increasing the voltage on node 321 to a first intermediate level. This first intermediate voltage, applied to the gate of transistor 311, barely turns on transistor 311. This allows transistor $305_2$ (or any other transistor 305 which is turned on) to act as a transmission gate, thereby pulling the voltage on node 322 close to the voltage on node 321. Because the voltage difference between nodes 321 and 322 is less than the threshold voltage of transistor 312, transistor 312 is in an off state. In this manner, node 321 remains stable at a second intermediate voltage which provides an optimal preset condition for the next input signal transition.

Specifically, if the previously high input signal on line $301_2$ transitions back to a low level, transistor $305_2$ turns off. Because no pull-down is provided for node 321, node 321 quickly increases to a high voltage because of turned-on transistor 309 and the strong pull-up transistor 310. This high voltage, applied to the gates of transistors 311 and 312, quickly turns on these transistors, thereby providing a low voltage on line 319 and a high voltage on line 318. In this manner, voltages on lines 318 and 319 are switched at very high speeds.

Figure 1:
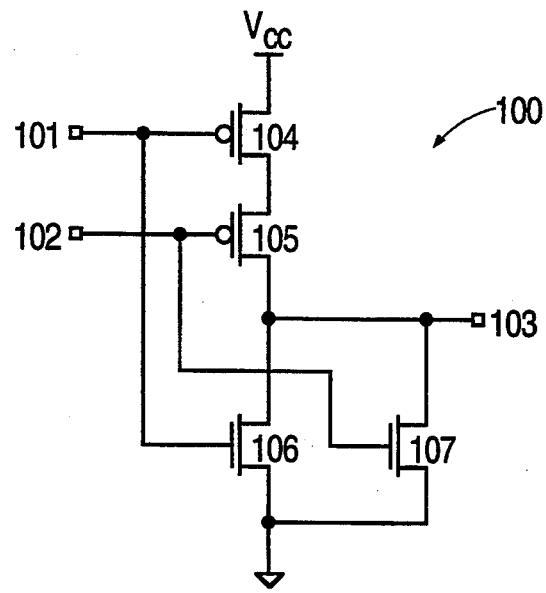
FIG. 1 illustrates a typical NOR gate using CMOS transistors.
Figure 2:
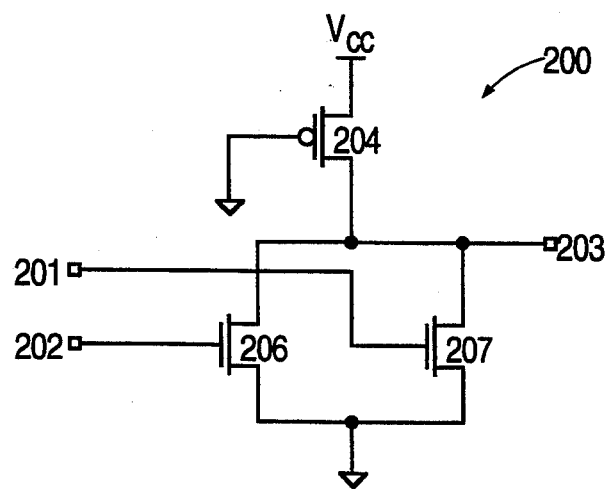
FIG. 2 illustrates another prior art NOR gate using CMOS transistors.

Thus in accordance with the present invention, transistor 309 functions as a weak pull-up device for holding node 321 at a high voltage, i.e. typically at voltage VCC, when pull-down devices, i.e. transistors 305, are in an off state, and transistor 310 functions as a strong pull-up device and is turned on when any one of the pull-down devices is in an on state. Pull-down transistors 305 clamp the gate and the source of transistor 312 to substantially the same voltage, thereby maintaining the off state of transistor 312 and providing a stable, intermediate voltage on node 321. The present invention provides the following advantages:

1. The feedback path, including inverter 316 and transistors 314 and 315, ensures that strong, pull-up transistor 310 is only turned on if pull-down transistor 305 is conducting.
2. Voltage source 320 is variable based on the voltage source $V_{cc}$ and the temperature of the integrated circuit (IC). Specifically, if the IC is operating at a higher temperature with a lower voltage $V_{cc}$, then voltage source 320 is typically ground. However, if the IC is operating at a lower temperature with a higher voltage $V_{cc}$, then voltage source 320 is typically 1 or 2 volts. Thus, voltage source 320 optimizes operation of transistor 310.
3. If transistor 310 is turned on, nodes 321 and 322 are clamped to the same voltage, thereby ensuring that transistor 312 is turned off irrespective of the strength of transistor 310. In this manner, a high voltage on line 319 is ensured, i.e., no intermediate voltages are possible, thereby significantly reducing the power consumption experienced by prior art NOR gates (see FIG. 2).
4. Because nodes 321 and 322 are clamped at an intermediate voltage level, the next transition, i.e., a low to high transition, occurs rapidly because node 321 is not held at ground and therefore more quickly attains the predetermined high voltage.

In this manner, the present invention eliminates excessive power consumption and other related problems, such as hot carrier injection while providing high speed input signal transitions.

The above description is meant to be illustrative and not limiting. For example, although the embodiment of the present invention shown in FIG. 3 illustrates a plurality of input lines 301, another embodiment provides only one input line. Moreover, inverter 317 is included to provide the NOR function in addition to the OR function provided by transistors 312 and 313. Those skilled in the art will be able to devise other configurations within the scope of the present invention upon consideration of the details description and the accompanying drawings. The present invention is set forth in the appended claims.

I claim:

1. A digital logic circuit having an input line and an output line, said digital logic circuit comprising:
    a pull-down device having a gate coupled to said input line, said pull-down device having a source and a drain;
    a plurality of pull-up devices having drains coupled to the drain of said pull-down device, wherein said plurality of pull-up devices include a first pull-up device and a second pull-up device, the second pull-up device having a higher conductivity than the first pull-up device; and
    means for providing a signal on said output line, said means for providing coupled to the source and the drain of said pull-down device and to the gate of said second pull-up device such that said second pull-up device is turned on and off in response to an input signal on said input line;
    wherein said first pull-up device is constantly maintained in a conductive state.

2. The digital logic circuit of claim 1 wherein said pull-down device comprises an N-channel transistor.

3. The digital logic circuit of claim 2 wherein said first and second pull-up devices comprise P-channel transistors.

4. The digital logic circuit of claim 3 wherein the drains of said second and first pull-up devices are coupled to a first voltage source.

5. The digital logic circuit of claim 4 wherein said means for providing a signal is coupled to said first voltage source and to a reference voltage source.

6. The digital logic circuit of claim 5 wherein said means for providing a signal is coupled to the drain of said pull-down device at a first node and the source of said pull-down device at a second node.

7. The digital logic circuit of claim 6 wherein the gate of said first pull-up device is coupled to said reference voltage source and the source of said first pull-up device is coupled to the drain of said pull-down device.

8. The digital logic circuit of claim 7 wherein said means for providing a signal comprises an inverter.

9. The digital logic circuit of claim 8 wherein said means for providing a signal further comprises:
a first P-channel transistor, wherein the source of said second first P-channel transistor is coupled to said first voltage source, the gate of said second first P-channel transistor is coupled to the drain of said first pull-up device, and the drain of said first P-channel transistor is coupled to the input line of said inverter.

10. The digital logic circuit of claim 9 wherein said means for providing a signal further comprises:
a first N-channel transistor, wherein the drain of said first N-channel transistor is coupled to the drain of said first P-channel transistor, the gate of said first N-channel transistor is coupled to the drain of said pull-down device, and the source of said first N-channel transistor is coupled to the source of said pull-down device.

11. The digital logic circuit of claim 10 wherein said means for providing a signal further comprises:
a second N-channel transistor, wherein the drain of said second N-channel transistor is coupled to said source of said first N-channel transistor, the gate of said second N-channel transistor is coupled to said drain of said pull-down device, and the source of said second N-channel transistor is coupled to said reference voltage source.

12. The digital logic circuit of claim 11 further comprising:
a plurality of N-channel pull-down devices connected in parallel with said pull-down device, and
a plurality of input lines, each of the plurality of input lines being coupled to the gate of one of said plurality of N-channel pull-down devices.

13. The digital logic circuit of claim 10 wherein when said first P-channel transistor is conducting, said first N-channel transistor is not conducting and said first and second nodes are clamped at substantially equal voltages.

14. The digital logic circuit of claim 12 further comprising a feedback circuit from said output line to said first P-channel transistor.

15. The digital logic circuit of claim 14 wherein said feedback circuit includes a second inverter coupled to said output line.

16. The digital logic circuit of claim 15 wherein said feedback circuit further includes a first P-channel transistor and a first N-channel transistor, wherein the gates of said first P-channel transistor and said first N-channel transistor are coupled to said second inverter, the source of said first P-channel transistor is coupled to said first voltage source, the drain of said first P-channel transistor is coupled to the drain of said first N-channel transistor, and the source of said first N-channel transistor is coupled to a second voltage source.

17. The digital logic circuit of claim 16 wherein said drain of said first P-channel transistor and said drain of said first N-channel transistor are coupled to said gate of said second pull-up device.

18. The digital logic circuit of claim 17 wherein said second voltage source is variable.

19. A method of providing a logic function comprising the steps of:
providing an input signal to a gate of a pull-down device;
coupling a first pull-up device and a second pull-up device to a drain of said pull-down device at a node, the second pull-up device having a higher conductance that the first pull-up device;
providing an output signal in response to a voltage on said node;
constantly maintaining said first pull-up device in a conductive state; and
providing a control signal on a gate of said second pull-up device such that when said pull-down device is off, said control signal turns off said second pull-up device and said first pull-up device pulls up said voltage on said node to a predetermined high level, and when said pull-down device is on, said control signal turns on said second pull-up device such that said second pull-up device pulls up said voltage on said node to a predetermined intermediate level.

20. The method of claim 19 further including the steps of providing a feedback signal in response to said output signal to control the state of said strong pull-up device.

* * * * *